United States Patent [19]

Usuda

[11] Patent Number: 5,060,051
[45] Date of Patent: Oct. 22, 1991

[54] SEMICONDUCTOR DEVICE HAVING IMPROVED ELECTRODE PAD STRUCTURE

[75] Inventor: Osamu Usuda, Tatsuno, Japan

[73] Assignee: Kabushiki Kaisha Toshiba, Kawasaki, Japan

[21] Appl. No.: 645,707

[22] Filed: Jan. 25, 1991

Related U.S. Application Data

[62] Division of Ser. No. 130,514, Dec. 9, 1987.

[30] Foreign Application Priority Data

Dec. 12, 1986 [JP] Japan .................................. 61-294902

[51] Int. Cl.⁵ .......................................... H01L 23/54
[52] U.S. Cl. ........................................ 357/71; 357/67
[58] Field of Search .................... 357/67, 71; 437/190, 437/192, 194

[56] References Cited

U.S. PATENT DOCUMENTS

| | | | |
|---|---|---|---|
| 4,176,443 | 12/1979 | Iannuzz et al. | 357/67 |
| 4,720,908 | 1/1988 | Wills | 357/71 |
| 4,724,475 | 2/1988 | Matsuda | 357/71 |

FOREIGN PATENT DOCUMENTS 0082012 6/1983 European Pat. Off. .
54-128280 4/1979 Japan ................................ 357/67

OTHER PUBLICATIONS

"Electronigration Improvement of AL-Cu or Au Conductors", Howard-IBM Technical Disclosure Bulletin vol. 21, No. 12, May 1979.

Primary Examiner—Rolf Hille
Assistant Examiner—S. V. Clark
Attorney, Agent, or Firm—Finnegan, Henderson, Farabow, Garrett, and Dunner

[57] ABSTRACT

In a semiconductor device in which copper or copper alloy bonding wire is bonded to an electrode pad on a semiconductor element, the electrode pad is formed of a first metal layer ohmically contacting the semiconductor element, a second metal layer hard enough not to be deformed at wire bonding step, and a third metal layer for bonding a copper wire, to suppress variation in the electric characteristics of a bonding portion and the production of stain in the semiconductor element at wire bonding step.

1 Claim, 2 Drawing Sheets

SEMICONDUCTOR DEVICE HAVING IMPROVED ELECTRODE PAD STRUCTURE

This is a division of application Ser. No. 130,514, filed Dec. 9, 1987, still pending.

BACKGROUND OF THE INVENTION

1. Field of the Invention

The present invention relates to a semiconductor device in which copper wire is used as a bonding wire and, more particularly, to improvements in the structure of electrode pads of a semiconductor device.

2. Description of the Prior Art

Heretofore, in a semiconductor device, copper or copper alloy is used as a bonding wire, and aluminum or aluminum alloy is used as an electrode pad, which is also known as bonding electrode. FIG. 1 is a sectional view of such a conventional semiconductor device which has yet to be wire-bonded. FIG. 2 is a sectional view of the semiconductor device which has been wire-bonded. In these figures, reference numeral 11 denotes a lead frame. Semiconductor element 13 is bonded to the lead frame by means of conductive paste 12, for example, silver paste, on the lead frame. Insulating films 14 are formed at predetermined positions on semiconductor element 13. Electrode pad 15, formed of a layer of aluminum or aluminum alloy, is formed on those portions of the semiconductor element which are not covered by the insulating films. As is shown in FIG. 2, copper bonding wire 16 is bonded to electrode pad 15. The electrode pad is deformed by the pressure of bonding the hard bonding wire to the electrode pad so that the bonding wire may contact semiconductor element 13 through the electrode pad as shown in FIG. 2. The direct contact of the wire with the element will alter the electric characteristics of the bonding portion, and mortally vary to malfunction the electric characteristics of the semiconductor device exposed at high temperature. Since the hard wire is pressed directly on semiconductor element 13, element 13 is distorted. Temperature changes, i.e., temperature cycles, cause the semiconductor element to have cracks, due to the difference in thermal expansion coefficients between the semiconductor element and the wire. The electrode pad is more easily corroded than other portions during patterning process, thus exposing the semiconductor element. Thus, the semiconductor device is liable to malfunction during use.

SUMMARY OF THE INVENTION

Accordingly, an object of the present invention is to provide a semiconductor device which prevents a wire from directly contacting a semiconductor device during wire bonding process.

Another object of the present invention is to provide a semiconductor device in which a wire is not pressed directly on a semiconductor element during wire bonding process, not producing strain in the semiconductor element.

Still another object of the invention is to provide a semiconductor device in which the electrode pad is not corroded to adversely influence a semiconductor element.

In order to achieve the above and other objects, there is provided according to the present invention a semiconductor device comprising a semiconductor element, an electrode pad formed on the element, and a copper wire bonded on the electrode pad and connecting the electrode pad to an external lead. The electrode pad is substantially formed of a first metal layer, a second metal layer, and a third metal layer. The first metal layer is formed on the semiconductor element, and ohmically contacts the semiconductor element, imposing no adverse influence on the functions of the semiconductor element. The second metal layer is formed on the first metal layer and has a hardness resisting against pressing force at wire bonding step. The third metal layer is formed on the second metal layer and has a composition for bonding a copper wire.

According to the present invention as described above, a three-layered electrode pad is used, and the second metal layer of the pad is formed of hard metal and can hardly be deformed. Thus, even if the third metal layer of the electrode pad is deformed at wire bonding step, the second metal layer remains undeformed. The electrode pad therefore does not directly contact the semiconductor element. Thus, the electric characteristics of the bonding portion do not change. Nor do the electric characteristics of the semiconductor element alter even at high temperature. Since the second metal layer is not deformed, the semiconductor element is not deformed to have strain, which results to have cracks during temperature changes. Further, even if the third metal layer of the electrode pad is corroded, the second metal layer is not; the corrosion does not advance to the surface of the semiconductor element. Therefore, the semiconductor element does not malfunction during use.

DESCRIPTION OF THE PREFERRED EMBODIMENTS

Figure 1:
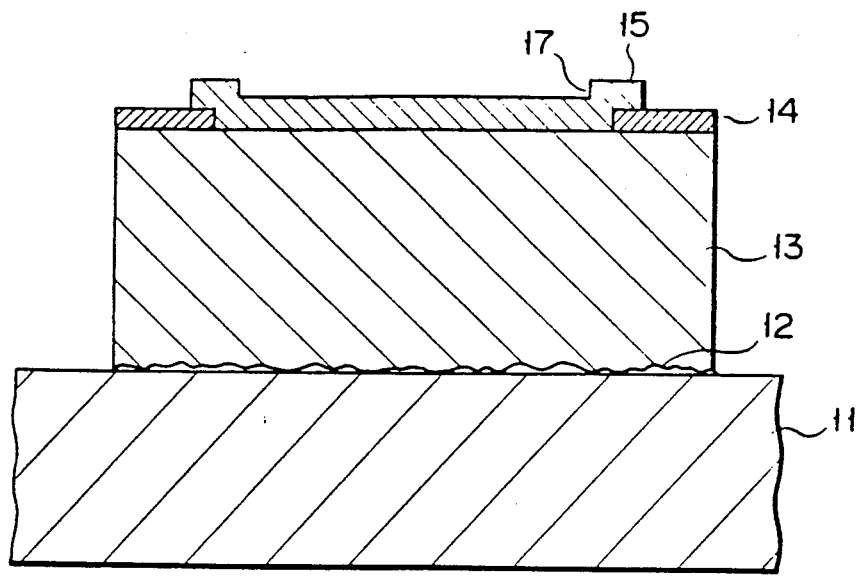
FIG. 1 is a sectional view of a conventional semiconductor device which has yet to be wire-bonded.

Preferred embodiments of the present invention will be described in detail with reference to the accompanying drawings. The same reference numerals as in the semiconductor device in FIGS. 1 and 2 denote the same parts in the embodiment of the present invention. In the semiconductor device shown in FIGS. 3 and 4, semiconductor element 13 is bonded by conductive paste 12 on lead frame 11. Insulating films 14 are formed at predetermined portions on the semiconductor element. Electrode pad 21 according to the present invention is formed on the portion on which the insulating films are not provided on the semiconductor element and the insulating films. Electrode pad 21 is fundamentally formed of three-layered structure metal layer. The first metal layer is formed on the semiconductor element to ohmically contact semiconductor element and to affect no adverse influence to the functions of the semiconductor element. The no adverse influence to the functions of the semiconductor element means no deterioration of the electric functions due to invasion of alloy element or impurities in the metal layer into the semiconductor element. First metal layer 18 is adapted for one metal selected from a group consisting of aluminum, aluminum alloys, gold and gold alloys. The aluminum alloys preferably contain at least 60 wt. % aluminum. Gold alloys preferably contain at least 60 wt. % gold. The preferable thickness of the first metal layer made of aluminum or aluminum alloys is 0.1 to 2.0 microns. The preferable thickness of the first metal layer made of gold or gold alloys is 0.2 to 2.0 microns. The reason why the preferably thickness of the first alloy layer is determined as described above is because, if excessively thin, the second metal diffuses to the semiconductor element to induce a damage of ohmic contact and, if excessively thick, second metal layer on the first metal layer easily deforms.

The second metal layer 19 is formed on the first metal layer, and the second metal layer has a hardness in which the layer is not deformed by the pressing force at wire bonding step. The hardness of the second metal is ordinarily lower than that of aluminum and aluminum alloys. The preferable metals of the second metal layer contain one metal selected from a group consisting of vanadium, vanadium alloys, nickel, nickel alloys, titanium, titanium alloys, tantalum and tantalum alloys. The vanadium and tantalum alloys preferably contain at least 60 wt. % vanadium or tantalum. The preferable thickness of the second metal layer made of the vanadium, vanadium alloys, tantalum or tantalum alloys is 0.05 to 1 micron. The nickel alloys preferably contain at least 60 wt. % nickel and one or two metals selected from a group consisting of at least 40 wt. % chronium and at least 40 wt. % cobalt. The preferable thickness of the second metal layer made of the nickel or nickel alloys is 300 to 10,000 angstroms. The titanium alloys preferably contain at least 60 wt. % titanium. The preferable thickness of the second alloy layer made of the titanium or titanium alloys is 300 to 10,000 angstroms. The reason why the preferable thickness of the second alloy layer is determined as described above is because, if excessively thin, desired hardness cannot be obtained, and if excessively thick, etching step is hardly achieved.

Third metal layer 20 is formed on the second metal layer, and the third metal layer has a composition for bonding a copper wire. The preferable metal of the third metal layer is one alloy selected from a group consisting of aluminum, aluminum alloys, gold and gold alloys. Aluminum alloys preferably contain at least 60 wt. % aluminum and gold alloys preferably contain at least 60 wt. % gold. The preferable thickness of the metal layer made of the aluminum or aluminum alloys is 0.1 to 5.0 microns. The preferable thickness of the gold or gold alloys is 0.2 to 2.5 microns. The reason why the preferable thickness of the third alloy layer is determined as described above is because, if excessively thin, oxidation of the second metal layer is induced, and if excessively thick, the second layer is hardly worked.

In the preferred embodiments, the first metal layer is made of aluminum or aluminum alloy of 0.5 to 2.5 microns of thickness, the second metal layer is made of vanadium or vanadium alloy of 0.1 to 0.8 micron of thickness, and the third metal layer is made of aluminum or aluminum alloy of 0 to 5.0 microns of thickness.

Electrode pad 21 is formed by the steps of sequentially evaporating the first to third metal layers on the surface of the semiconductor element and the insulating films, and then patterning by etching the metal layers. In the wire bonding step, lead frame 11 is heated to 200° to 450° C., and copper bonding wire 16 is bonded on third metal layer 20 by means of vibration by thermally press-bonding or ultrasonic wave.

According to the construction as described above, soft third metal layer 20 is deformed by the pressing force of wire 16 at wire bonding step, but hard second metal layer 19 is not deformed, and the deformation does not reach first metal layer 18. Thus, the wire is not contacted with semiconductor element 13, and no stress is applied to the semiconductor element. Therefore, the electric characteristics of the semiconductor device are not varied, nor the semiconductor element is cracked. Since the second metal layer prevents the corrosion from advancing to the first metal layer at the step of patterning electrode pad 21, the element 13 is hardly corroded to cause no electric malfunction to occur, and the electric characteristics do not alter even in a test exposing at high temperature. Four or more layered electrode pad may be constructed as a metal layer on the three-layered metal above described or a metal layer among the three-layered metal above described.

Figure 2:
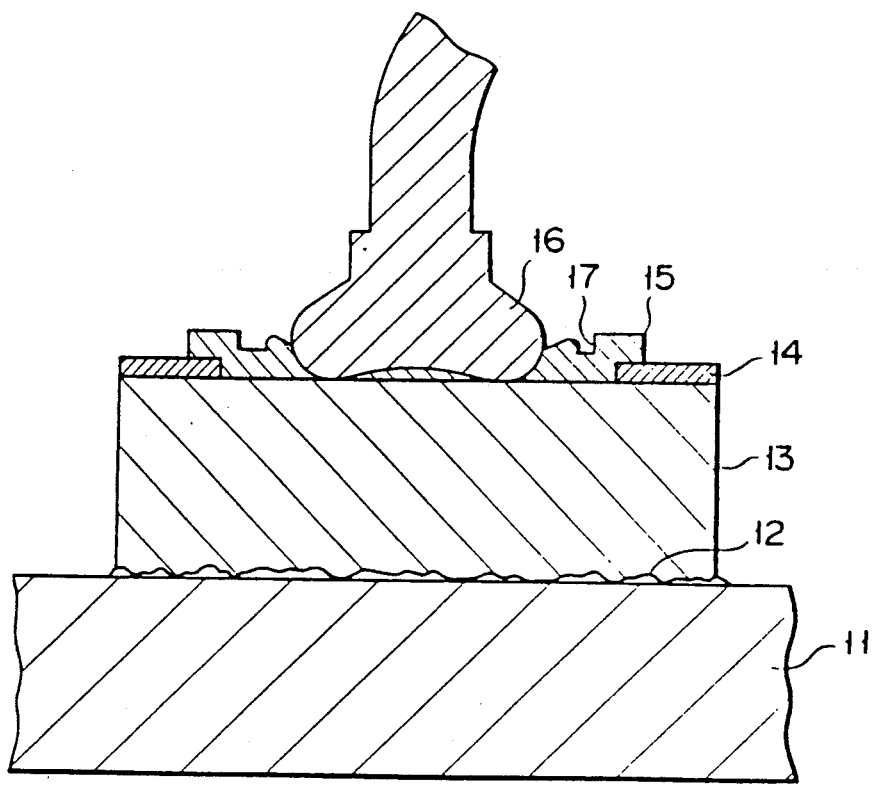
FIG. 2 is a sectional view of the semiconductor device which has been wire-bonded.
Figure 3:
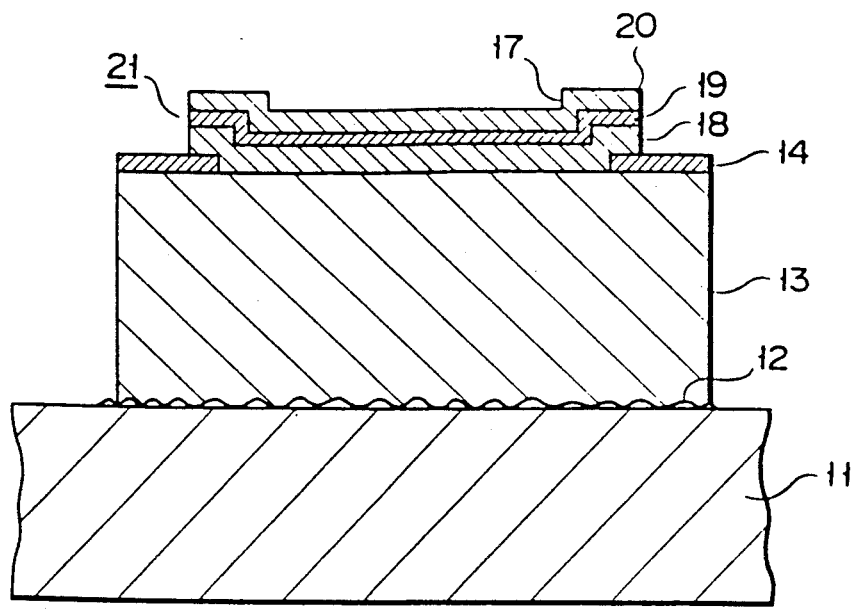
FIG. 3 is a sectional view of a semiconductor device according to the present invention, which has yet to be wire-bonded.
Figure 4:
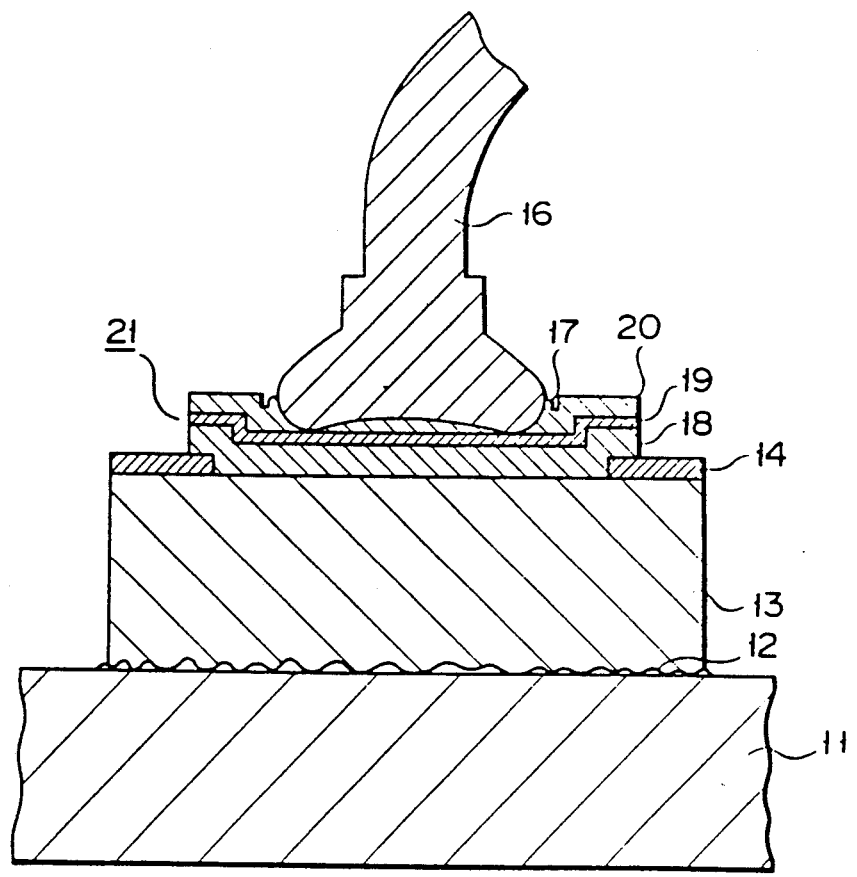
FIG. 4 is a sectional view of the semiconductor device of this invention, which has been wire-bonded.

The semiconductor device as shown in FIGS. 3 and 4 according to the present invention was actually manufactured, and the malfunction occurring ratio was compared with that of the semiconductor device as shown in FIGS. 1 and 2. In this case, in the electrode pad of the present invention, the first metal layer was made of aluminum of 0.5 microns of thickness, the second metal layer was made of vanadium of 0.3 microns of thickness, and the third metal layer is made of aluminum of 2.5 microns of thickness. The electrode pad of the conventional semiconductor device was formed of a single layer made of aluminum of 2.5 microns of thickness. These semiconductor devices were tested by a heat cycle test of periodically repeating high temperature of 150° C. and low temperature of −45° C., and both were compared. Then, the conventional semiconductor device became improper in 25% in 400 cycles, and in 80% in 600 cycles. Conversely, the semiconductor device according to the present invention did not become improper in not only 400 cycles but 600 cycles. The semiconductor device was manufactured by bonding by increasing the load to 300 gram as high as twice at the normal bonding wire bonding step, and the malfunction occurring ratio was observed. Then, the ratio of the conventional structure was 30 to 50%, while that of the device according to the present invention was less than 0.1%.

What is claimed is:

1. A semiconductor device comprising a semiconductor element, an electrode pad on the element, and a copper wire bonded on the electrode pad and connecting the electrode pad to an external lead, wherein said electrode pad comprises:

a first metal layer consisting essentially of aluminum or an aluminum alloy on the semiconductor element, ohmically contacting the semiconductor element and having a thickness of 0.5 to 2.5 micrometers, a second metal layer consisting essentially of vanadium or a vanadium alloy on the first metal layer and having a thickness of 0.1 to 0.8 micrometers, and a third metal layer consisting essentially of aluminum or an aluminum alloy on the second metal layer and having a thickness of 0.5 to 5.0 micrometers.

* * * * *